United States Patent
Hwang et al.

(10) Patent No.: US 7,351,667 B2
(45) Date of Patent: Apr. 1, 2008

(54) ETCHING SOLUTION FOR SILICON OXIDE METHOD OF MANUFACTURING A SEMICONDUCTOR DEVICE USING THE SAME

(75) Inventors: Dong-Won Hwang, Suwon-si (KR); Hun-Jung Yi, Yongin-si (KR); Kwang-Shin Lim, Yongin-si (KR); Jung-Dae Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/580,937

(22) Filed: Oct. 16, 2006

(65) Prior Publication Data

US 2007/0090325 A1    Apr. 26, 2007

(30) Foreign Application Priority Data

Oct. 26, 2005    (KR) ...................... 10-2005-0101017

(51) Int. Cl.
*H01L 21/469* (2006.01)
(52) U.S. Cl. ...................... 438/745; 438/689; 438/704; 216/89; 216/83; 134/1.3
(58) Field of Classification Search ................ 438/745; 216/89; 134/1.3
See application file for complete search history.

(56) References Cited

U.S. PATENT DOCUMENTS 4,890,141 A * 12/1989 Tang et al. .................. 257/372

7,094,660 B2 * 8/2006 Park ............................ 438/386
2005/0081883 A1 * 4/2005 Ko et al. ...................... 134/1.3

FOREIGN PATENT DOCUMENTS

| JP | 10-189722 | 7/1998 |
| JP | 11-087325 | 3/1999 |
| JP | 11-135490 | 5/1999 |
| KR | 1999-65097 | 8/1999 |
| KR | 10-0453908 | 10/2004 |

OTHER PUBLICATIONS

S. Wolf, Silicon Processing for the VLSI Era, vol. 1, Lattice Press (1986), pp. 532-533.*

* cited by examiner

*Primary Examiner*—Duy-Vu N. Deo
*Assistant Examiner*—Maki Angadi
(74) *Attorney, Agent, or Firm*—Volentine & Whitt, PLLC

(57) ABSTRACT

An etching solution for silicon oxide may be used in a process for enlarging an opening formed through a silicon oxide layer. The etching solution includes about 0.2 to about 5.0 percent by weight of a hydrogen fluoride solution, about 0.05 to about 20.0 percent by weight of an ammonium fluoride solution, about 40.0 to about 70.0 percent by weight of an alkyl hydroxide solution and remaining water. The etching solution may etch the silicon oxide layer without damage to a metal silicide layer exposed by the opening.

10 Claims, 12 Drawing Sheets

US 7,351,667 B2

ETCHING SOLUTION FOR SILICON OXIDE METHOD OF MANUFACTURING A SEMICONDUCTOR DEVICE USING THE SAME

BACKGROUND OF THE INVENTION

1. Field of the Invention

Example embodiments of the disclosed methods and systems relate to an etching solution for silicon oxide and methods of manufacturing a semiconductor device using the etching solution. More particularly, example embodiments of the disclosed methods and systems relate to an etching solution for silicon oxide employed in etching processes to expand an opening formed on a silicon oxide layer, as well as methods of manufacturing a semiconductor device using the etching solution.

This application claims priority under 35 USC § 119 to Korean Patent Application No. 2005-101017 filed on Oct. 26, 2005, the contents of which are herein incorporated by reference in their entirety.

2. Description of the Related Art

As semiconductor devices have been required to process data at ever faster speeds, the sizes of semiconductor elements have been considerably reduced, which in part have spurred the development of three-dimensional, multi-layer structures. When wiring (and/or other patterns) in a semiconductor device are highly integrated, an interval between the wirings (or other patterns) is greatly reduced. Unfortunately, this may lead to an increased problem with respect to alignment errors that occur during the photographic processes for making photoresist patterns used in etching/forming contact holes through insulating interlayer between wirings and/or other patterns.

Because current semiconductor devices have design rules below about 80 nm, an opening formed through an insulating interlayer between conductive structures, such as bit lines, may have a greatly reduced width. As the width of the opening exposing a contact region or a pad formed on a substrate is considerably decreased, the exposed area of the contact region (or pad) also may be considerably reduced. As a result, because of an insufficient contact margin between a plug for a capacitor and another contact region (or pad), the plug for the capacitor may not make the appropriate contact.

To address the above-mentioned problem, an etching solution including hydrogen fluoride and ammonium fluoride (e.g., an LAL solution) is used to enlarge a width of an opening where a plug for a capacitor is formed, thereby ensuring an appropriate contact margin between the plug for a capacitor and another contact region/pad.

Unfortunately, such an etching solution may undesirably etch metal silicide patterns of a conductive structure exposed by the enlarged opening.

FIG. 1 is an electron microscopic picture showing damage to a metal silicide pattern caused by the etching solution including hydrogen fluoride and ammonium fluoride in a process for enlarging an opening formed through a silicon oxide layer. As shown in FIG. 1, the metal silicide pattern may be excessively damaged because the LAL etching solution can easily etch the metal silicide pattern as well as silicon oxide. When the metal silicide pattern is damaged, nitride may penetrate into a damaged portion of the metal silicide pattern during a process for forming a spacer on a sidewall of the metal silicide pattern, thereby increasing the resistance of the metal silicide pattern. As a result, a conductive structure including the metal silicide pattern such as a bit line may have a greatly increased resistance so that electrical characteristics of a semiconductor device may be deteriorated.

SUMMARY OF THE INVENTION

Example embodiments of the disclosed methods and systems provide an etching solution and method of manufacture for effectively removing silicon oxide without damage to metal silicide.

In various embodiments, an etching solution for silicon oxide includes about 0.2 to about 5.0 percent by weight of a hydrogen fluoride (HF) solution, about 0.05 to about 20.0 percent by weight an ammonium fluoride ($NH_4F$) solution, and about 40.0 to about 70.0 percent by weight of an alkyl hydroxide solution, wherein the etching solution etches a silicon oxide layer preventing damage to a metal silicide layer exposed by an opening in a process for enlarging the opening through the silicon oxide layer.

In various other embodiments, a method of manufacturing a semiconductor device includes forming a first contact pad and a second contact pad on a substrate, forming a conductive structure including a metal silicide layer pattern electrically connected to the second contact pad, forming a silicon oxide layer on the substrate to cover the conductive structure, the silicon oxide layer including a first opening exposing the first contact pad and etching the silicon oxide layer using an etching solution for silicon oxide while preventing damage to the metal silicide layer pattern to form a second opening having a width greater than that of the first opening, wherein the etching solution comprises about 0.2 to about 5.0 percent by weight of a hydrogen fluoride solution, about 0.05 to about 20.0 percent by weight of an ammonium fluoride solution, about 40.0 to about 70.0 percent by weight of an alkyl hydroxide solution and water.

BRIEF DESCRIPTION OF THE DRAWINGS

The above and other features and advantages of the disclosed methods and systems will become more apparent by describing in detailed exemplary embodiments thereof with reference to the accompanying drawings, in which.

DESCRIPTION OF THE INVENTION

Figure 1:
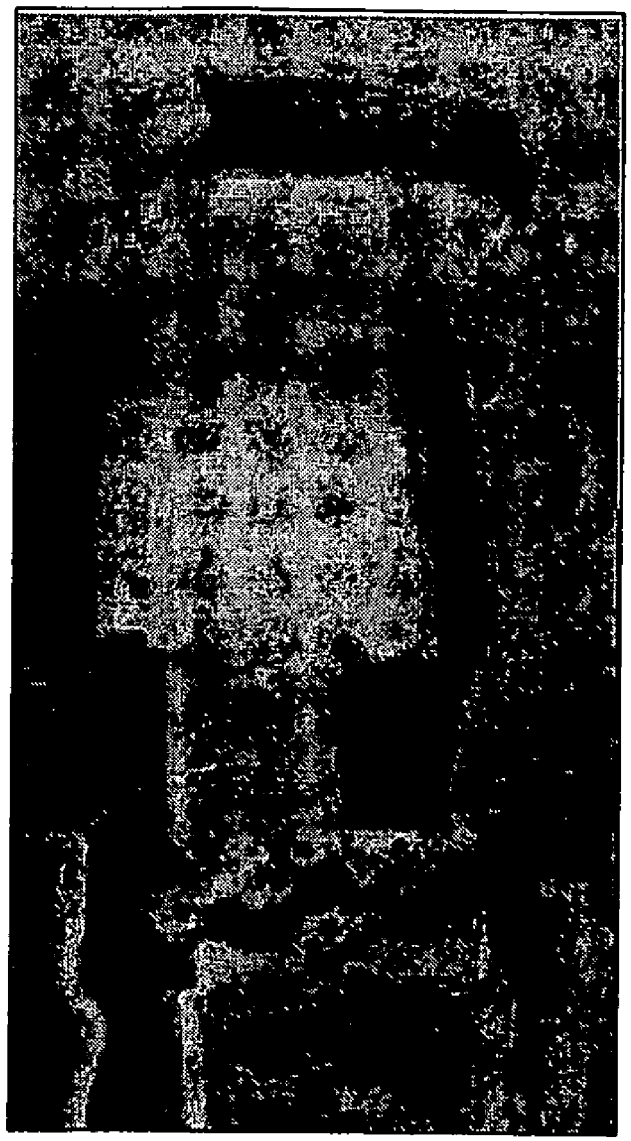
FIG. 1 is an electron microscopic picture showing damage to a metal silicide pattern caused by the etching solution including hydrogen fluoride and ammonium fluoride in a process for enlarging an opening formed through a silicon oxide layer.

The disclosed methods and systems are described more fully hereinafter with reference to the accompanying drawings, in which exemplary embodiments of the disclosed methods and systems are shown. The disclosed methods and systems may, however, be embodied in many different forms and should not be construed as limited to the exemplary embodiments set forth herein. Rather, these embodiments are provided so that this disclosure will be thorough and complete, and will fully convey the scope of the disclosed methods and systems to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Further, as used herein, the term "and/or" includes any and all combinations of one or more of the associated listed items.

It also will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosed methods and systems.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized embodiments (and intermediate structures) of the disclosed methods and systems. As such, variations from the shapes of the illustrations as a result, for example, of manufacturing techniques and/or tolerances, are to be expected. Thus, exemplary embodiments of the disclosed methods and systems should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosed methods and systems.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Etching Solution for Silicon Oxide

In a process for enlarging a width of an opening formed through a silicon oxide layer, an etching solution for silicon oxide according to example embodiments of the disclosed methods and systems may effectively prevent damage to a metal silicide layer exposed by the enlarged opening. Additionally, a portion of a silicon oxide layer may be efficiently etched by the etching solution for silicon oxide. That is, the etching solution for removing silicon oxide may rapidly etch a silicon oxide layer while reducing etched damage to a metal silicide layer.

In some exemplary embodiments of the disclosed methods and systems, the etching solution for silicon oxide may include a hydrogen fluoride (HF) solution, an ammonium fluoride ($NH_4F$) solution, an alkyl hydroxide solution and water. For example, the etching solution for silicon oxide may include about 0.2 to about 5.0 percent by weight of the hydrogen fluoride solution, about 0.05 to about 20.0 percent by weight of the ammonium fluoride solution, about 40.0 to about 70.0 percent by weight of the alkyl hydroxide solution based on a total weight of the etching solution, and remaining water.

In some example embodiments of the disclosed methods and systems, a composition of the etching solution for silicon oxide may vary in accordance with types of silicon oxide layers to be etched. Examples of the silicon oxide layers may include a boro-phosphor silicate glass (BPSG) layer, a phosphor silicate glass (PSG) layer, an undoped silicate glass (USG) layer, a flowable oxide (FOX) layer, a spin-on-glass (SOG) layer, a high density. plasma (HDP) oxide layer, etc. Alternatively, the silicon oxide layer may have a multi-layer structure that includes a BPSG layer, a PSG layer, a USG layer, a FOX layer, an SOG layer and/or an HDP oxide layer.

The hydrogen fluoride in the etching solution for silicon oxide may serve as an etchant that effectively etches the silicon oxide layer in a wet etching process for enlarging the width of the opening formed through the silicon oxide layer.

The ammonium fluoride in the etching solution for silicon oxide may serve as a buffer solution that controls an etch rate of the silicon oxide layer and an etch rate of the metal silicide layer in the process for enlarging the opening formed through the silicon oxide layer.

The alkyl hydroxide in the etching solution for silicon oxide may serve as an etch-stop agent that reduces an etched amount of the metal silicide layer exposed by the opening in the process for enlarging the opening through the silicon oxide layer.

In an exemplary embodiment of the disclosed methods and systems, when a silicon oxide layer includes HDP oxide, the etching solution for silicon oxide may include about 0.5 to about 2.0 percent by weight of the hydrogen fluoride solution, about 10.0 to about 18.0 percent by weight of the ammonium fluoride solution, about 50.0 to about 70.0 percent by weight of the alkyl hydroxide solution based on a total weight of the etching solution, and remaining water.

When the content of the hydrogen fluoride solution in the etching solution for silicon oxide is below about 0.5 percent by weight based on the total weight of the etching solution, the etched amount of a silicon oxide layer may be considerably reduced. On the other hand, when the content of the hydrogen fluoride solution in the etching solution for silicon oxide is above about 5.0 percent by weight, a metal silicide layer may be excessively etched. Therefore, in various embodiments the content of the hydrogen fluoride solution in the etching solution for silicon oxide may be in a range of about 0.5 to about 5.0 percent by weight. Further, the content of the hydrogen fluoride solution in the etching solution may preferably be from about 0.6 to about 2.0 percent by weight, and more preferably, from about 0.7 to about 1.2 percent by weight.

When the content of the ammonium fluoride solution in the etching solution for silicon oxide is below about 10.0 percent by weight based on the total weight of the etching solution, the ammonium fluoride solution may not properly serve as a buffer solution so that etch rates of a silicon oxide layer and a metal silicide layer may not be advantageously controlled. Note, however, that when the content of ammonium fluoride solution in an etching solution for silicon oxide is above about 18.0 percent by weight, the etched amount of a silicon oxide layer may be undesirably reduced. Therefore, in various embodiments the content of the ammonium fluoride solution in the etching solution for silicon oxide may be in a range of about 10.0 to about 18.0 percent by weight. Preferably, the content of the ammonium fluoride solution in the etching solution may be in a range of about 13.0 to about 18.0 percent by weight, and more preferably, in a range of about 15.0 to about 18.0 percent by weight.

When the content of the alkyl hydroxide solution in the etching solution for silicon oxide is below about 50.0 percent by weight based on the total weight of the etching solution, the alkyl hydroxide may not serve as the etch-stop agent for preventing the metal silicide layer from being etched such that the metal silicide layer may be excessively etched. On the other hand, when the content of the alkyl hydroxide solution in the etching solution is above about 70.0 percent by weight, the metal silicide layer may be etched at a constant etch rate. Thus, in various embodiments the content of the alkyl hydroxide solution in the etching solution for silicon oxide may be in a range of about 50.0 to about 70.0 percent by weight. Preferably, the etching solution for silicon oxide may include about 52.0 to about 65.0 percent by weight of the alkyl hydroxide solution, and more preferably, about 54.0 to about 60.0 percent by weight of the alkyl hydroxide solution.

Examples of the alkyl hydroxide may include an alcohol-based material such as ethylene glycol, propylene glycol, glycerol, methanol, ethanol, isopropyl alcohol, etc. These can be used alone or in a mixture thereof.

Any water in the etching solution for silicon oxide may be used to control the contents of ingredients in the etching solution. Additionally, water may be used to desirably adjust concentrations of the ingredients in the etching solution for silicon oxide so as to prevent damage to the metal silicide layer.

In some example embodiments of the disclosed methods and systems, the etching solution for silicon oxide may have an etching selectivity of about 1.0:1.5 to about 1.0:2.5 between BPSG and HDP oxide. For example, the etching solution for silicon oxide may have an etching selectivity of about 1.0:1.7 to about 1.0:2.2 between BPSG and HDP oxide.

In some example embodiments of the disclosed methods and systems, the etching solution for silicon oxide may etch a BPSG layer at an etch rate of about 135 to about 190 Å/minute. In addition, the etching solution for silicon oxide may be used to etch an HDP oxide layer at an etch rate of about 270 to about 350 Å/minute.

In other example embodiments of the disclosed methods and systems, the etching solution for silicon oxide may include the hydrogen fluoride solution and the ammonium fluoride solution by a volume ratio of about 1.0:7.0 to about 1.0:20.0. For example, the volume ratio between the hydrogen fluoride solution and the ammonium fluoride solution may be in a range of about 1.0:7.0 to about 1.0:10.0.

Continuing, the etching solution for silicon oxide may be used to effectively etch a multi-layer structure that include the BPSG layer and the HDP oxide layer at an etch rate substantially the same as the above-mentioned etch rate. Further, the etching solution for silicon oxide may be used to efficiently etch other multi-layer structures including a BPSG layer, an HDP oxide layer, an SOG layer, a USG layer and/or a FOX layer.

In instances where a silicon oxide layer includes BPSG, the etching solution for silicon oxide may include about 0.2 to about 0.5 percent by weight of the hydrogen fluoride solution, about 0.05 to about 0.2 percent by weight of the ammonium fluoride solution, about 55.0 to about 70.0 percent by weight of the alkyl hydroxide solution based on the total weight of the etching solution and remaining water.

When the content of the hydrogen fluoride solution in the etching solution for silicon oxide is below about 0.2 percent by weight, the etched amount of the silicon oxide layer may be considerably reduced. When the content of hydrogen fluoride solution in the etching solution for silicon oxide is above about 0.5 percent by weight, the etched amount of the metal silicide layer may be increased. Accordingly, in various embodiments the content of the hydrogen fluoride solution in the etching solution for silicon oxide may be in a range of about 0.2 to about 0.5 percent by weight. Preferably, the etching solution for silicon oxide may include from about 0.2 to about 0.4 percent by weight of the hydrogen fluoride solution, and more preferably, from about 0.2 to about 0.3 percent by weight of the hydrogen fluoride solution.

When the content of the ammonium fluoride solution in the etching solution for silicon oxide is below about 0.05 percent by weight based on the total weight of the etching solution, the ammonium fluoride may not serve as the buffer solution so that the etch rates of the silicon oxide layer and metal silicide layer may not be desirably controlled. When the content of the ammonium fluoride solution in the etching solution for silicon oxide is above about 0.2 percent by weight, the etching solution may not sufficiently etch the silicon oxide layer. Therefore, the content of the ammonium fluoride solution in the etching solution for silicon oxide may be in a range of about 0.05 to about 0.2 percent by weight based on the total weight of the etching solution. Preferably, the etching solution may include from about 0.08 to about 0.15 percent by weight of the ammonium fluoride solution, and more preferably, from about 0.08 to about 0.12 percent by weight of the ammonium fluoride solution.

When the content of the alkyl hydroxide solution in the etching solution for silicon oxide is below about 55.0 percent by weight based on the total weight of the etching solution, the alkyl hydroxide may not serve as the etch-stop agent for the metal silicide layer. When the content of the alkyl hydroxide solution in the etching solution for silicon oxide is above about 70.0 percent by weight, the metal silicide layer may be undesirably etched at a constant etch rate. Hence, in various embodiments the content of the alkyl hydroxide solution in the etching solution for silicon oxide may be in a range of about 55.0 to about 70.0 percent by weight based on the total weight of the etching solution. Preferably, the etching solution for silicon oxide may include about 55.0 to about 65.0 percent by weight of the alkyl hydroxide solution, and more preferably, about 58.0 to about 62.0 percent by weight of the alkyl hydroxide solution. Examples of alkyl hydroxide may include ethylene glycol, propylene glycol, glycerol, methanol, ethanol, isopropyl alcohol, etc. These can be used alone or in a mixture thereof.

Water in the etching solution for silicon oxide may adjust the contents of ingredients in the etching solution for silicon oxide. Further, water may desirably control the concentrations of ingredients in the etching solution for silicon oxide.

In some example embodiments of the disclosed methods and systems, the etching solution for silicon oxide may have an etching selectivity of about 1.0:0.3 to about 1.0:0.5 between BPSG and HDP oxide. Preferably, the etching solution may have an etching selectivity of about 1.0:0.2 to about 1.0:0.5 between BPSG and HDP oxide, and more preferably an etching selectivity of about 1.0:0.3 to about 1.0:0.5 between BPSG and HDP oxide.

In various example embodiments of the disclosed methods and systems, the etching solution for silicon oxide may be used to etch the BPSG layer at an etch rate of about 32 to about 45 Å/minute. Further, the etching solution for silicon oxide may etch the HDP oxide layer at an etch rate of about 9 Å/minute to about 18 Å/minute.

The etching solution for silicon oxide may be used to efficiently etch a multi-layer structure including the BPSG layer and the HDP oxide layer. Further, the etching solution for silicon oxide may be advantageously used in a process for etching other multi-layer structures that include the BPSG layer, the HDP oxide layer, the USG layer, the SOG layer and/or the FOX layer.

The etching solution for silicon oxide may be advantageously used in various processes for forming various semiconductor devices such as a dynamic random access memory (DRAM) device, a static random access memory (SRAM), a flash memory devices and so on. For example, the etching solution for silicon oxide may effectively etch various silicon oxide layers in the DRAM device, the SRAM device or the flash memory device. Further, the etching solution for silicon oxide may efficiently etch the silicon oxide layer in a process for enlarging an opening formed through the silicon oxide layer while preventing damage to a metal silicide layer exposed by the opening.

Method of Manufacturing a Semiconductor Device

FIGS. 2 to 12 are cross-sectional views illustrating a method of manufacturing a semiconductor device using an etching solution for silicon oxide in accordance with example embodiments of the disclosed methods and systems.

Figure 2:
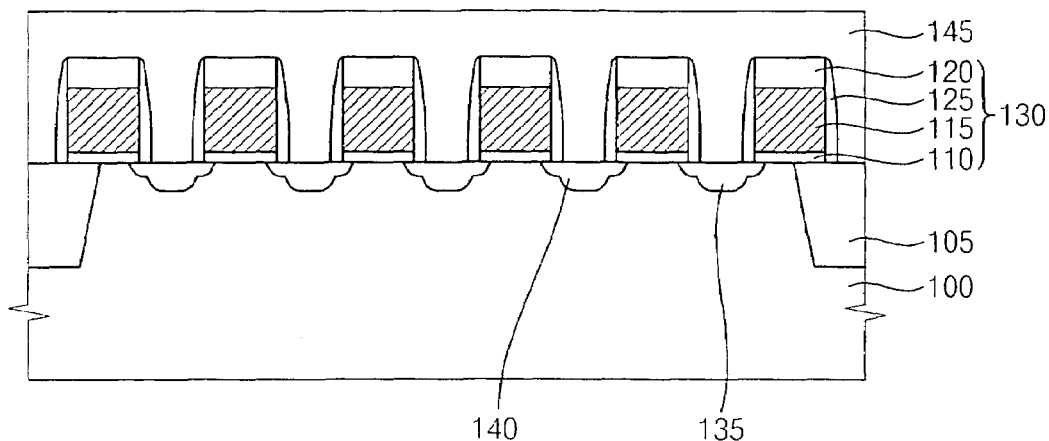
FIGS. 2 to 12 are cross-sectional views illustrating a method of manufacturing a semiconductor device using an etching solution for removing silicon oxide in accordance with example embodiments of the disclosed methods and systems.

FIG. 2 illustrates steps of forming a gate structure 130 and a first insulating interlayer 145 on a semiconductor substrate 100. As shown in FIG. 2, an isolation layer 105 can be formed on the semiconductor substrate 100 to divide the semiconductor substrate 100 into an active region and a field region. The isolation layer 105 may be formed by a shallow trench isolation (STI) process, a thermal oxidation process or any other viable process.

A gate insulation layer (not shown) is formed on the semiconductor substrate 100 having the isolation layer 105. The gate insulation layer may be formed by a thermal oxidation process, a chemical vapor deposition (CVD) process, an atom layer deposition (ALD) process, etc. The gate insulation layer may be formed using silicon oxide or a high dielectric material such as a metal oxide or a silicon nitride. Examples of the metal oxide for the gate insulation layer may include hafnium oxide ($HfO_2$), zirconium oxide ($ZrO_2$), tantalum oxide ($Ta_2O_5$), yttrium oxide ($Y_2O_3$), niobium oxide ($Nb_2O_5$), aluminum oxide ($Al_2O_3$), titanium oxide ($TiO_2$), cerium oxide ($CeO_2$), indium oxide ($In_2O_3$), ruthenium oxide ($RuO_2$), magnesium oxide (MgO), strontium oxide (SrO), boron oxide ($B_2O_3$), tin oxide ($SnO_2$), compounds of lead oxide (e.g., PbO, $PbO_2$, $Pb_3O_4$, etc.), vanadium oxide ($V_2O_3$), lanthanum oxide ($La_2O_3$), praseodymium oxide ($Pr_2O_3$), antimony oxide ($Sb_2O_5$), calcium oxide (CaO), etc. These can be used alone or in a mixture thereof.

A first conductive layer and a gate mask 120 can be subsequently formed on the gate insulation layer. The first conductive layer may be formed using doped polysilicon. The first conductive layer can be patterned to form a gate electrode 115 on the gate insulation layer. In an example embodiment of the disclosed methods and systems, the first conductive layer may have a multi-layer structure that includes a doped polysilicon film and a metal silicide film.

The first conductive layer and the gate insulation layer are etched using the gate mask 120 as an etching mask so that a gate structure 130 is formed on the semiconductor substrate 100. The gate structure 130 includes a gate insulation pattern 110, the gate electrode 115 and the gate mask 120.

A gate spacer 125 can be formed on both sidewalls of the gate structure 130. Accordingly, a word line can be formed on the semiconductor substrate 100. In some example embodiments of the disclosed methods and systems, a plurality of word lines may be formed in parallel with one another on the semiconductor substrate 100.

Impurities can be doped into portions of the semiconductor substrate 100 adjacent to the gate structure 130 using the gate structure 130 as an ion implantation mask. Thus, a first impurity region 135 and a second impurity region 140 may be formed at the portions of the semiconductor substrate 100 after performing a thermal treatment process.

In some example embodiments of the disclosed methods and systems, the first and the second impurity regions 135 and 140 may correspond to source and drain regions, respectively. Additionally, the first impurity region 135 and the second impurity region 140 may correspond to a capacitor contact region and a bit line contact region. Still further, a first contact pad 150 (see FIG. 3) can make contact with the first impurity region 135, and a second contact pad 155 (see FIG. 3) can make contact with the second impurity region 140. As a result, transistors may be formed on the semiconductor substrate 100 with each of the transistors having the gate structure 130, the gate spacer 125, the first impurity region 135 and the second impurity region 140.

A first insulating interlayer 145 can then be formed on the semiconductor substrate 100 to cover the gate structure 130. In various embodiments, the first insulating interlayer 145 may be formed using silicon oxide such as BPSG, PSG, SOG, FOX, USG, HDP oxide and so on. In other example embodiments of the disclosed methods and systems, the first insulating interlayer 145 may be formed using BPSG.

In an example embodiment of the disclosed methods and systems, an upper portion of the first insulating interlayer 145 may be planarized. For example, the upper portion of the first insulating interlayer 145 may be planarized by a chemical mechanical polishing (CMP) process and/or an etch-back process. In various embodiments, the first insulating interlayer 145 may be planarized until the gate structure 130 is exposed so that the first insulating interlayer 145 may have a height substantially the same as that of the gate structure 130. In other embodiments, the first insulating interlayer 145 may have a height substantially higher than that of the gate structure 130 when the first insulating interlayer 145 is planarized without an exposure of the gate structure 130.

Figure 3:
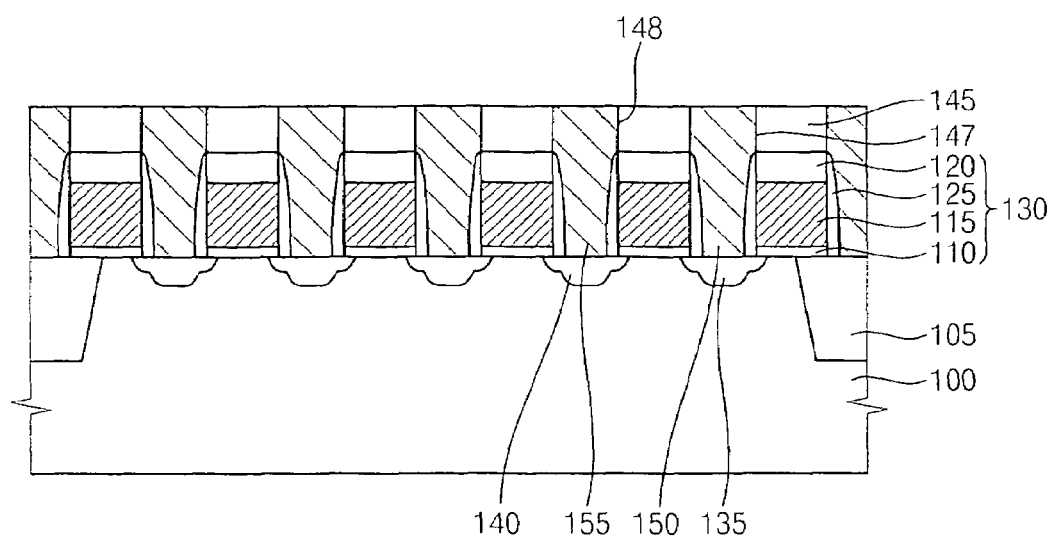

FIG. 3 illustrates various steps for forming the first contact pad 150 and the second contact pad 155. Referring to FIG. 3, after a first photoresist pattern (not shown) is formed on the first insulating interlayer 145, the first insulating interlayer 145 can be partially etched using the first photoresist pattern as an etching mask, thereby forming a first contact hole 147 and a second contact hole 148 through the first insulating interlayer 145. Note that the first and the second contact holes 147 and 148 may expose the first and the second impurity regions 135 and 140, respectively.

In an example embodiment of the disclosed methods and systems, the first and the second contact holes 147 and 148 may be formed using a self-alignment process. That is, the first and the second contact holes 147 and 148 may be formed through the first insulating interlayer 145 while the first and the second contact holes 147 and 148 are aligned with respect to the gate structure 130.

The first contact hole 147 exposes the first impurity region 135 corresponding to the capacitor contact region, whereas the second contact hole 148 exposes the second impurity region 140 corresponding to the bit line contact region. After forming the first and the second contact holes 147 and 148, the first photoresist pattern is removed from the first insulating interlayer 145. The first photoresist pattern may be removed by an ashing process, a stripping process and/or a cleaning process.

A second conductive layer can be formed on the first insulating interlayer 145 to fill the first and the second contact holes 147 and 148. The second conductive layer may be formed using doped polysilicon having a high impurity concentration, a metal or a conductive metal nitride. In some example embodiment of the disclosed methods and systems, the second conductive layer may be formed using doped polysilicon.

The second conductive layer may be planarized until the first insulating interlayer 145 is exposed by a CMP process and/or an etch-back process. Thus, the first contact pad 150 and the second contact pad 155 corresponding to self-aligned contact (SAC) pads may be formed to fill the first and the second contact holes 147 and 148. The first contact pad 150 may be formed on the first impurity region 135, and the second contact pad 155 may be positioned on the second impurity region 140. That is, the first contact pad 150 may make contact with the capacitor contact region and the second contact pad 155 may make contact with the bit line contact region.

Figure 4:
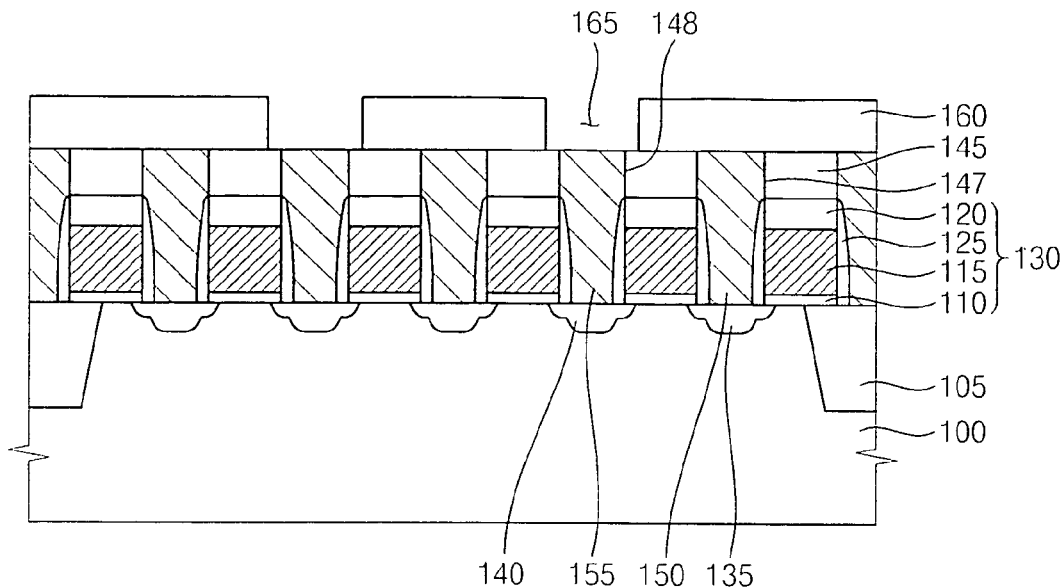

FIG. 4 illustrates various steps for forming a second insulating interlayer 160 and a third contact hole 165. Referring to FIG. 4, the second insulating interlayer 160 is formed on the first insulating interlayer 145 including the first contact pad 150 and the second contact pad 155. The second insulating interlayer 160 may electrically insulate the first contact pad 150 from a bit line 175 (see FIG. 5). The second insulating interlayer 160 may additionally insulate a third contact pad 190 (see FIG. 8) from the bit line 175.

The second insulating interlayer 160 may be formed using silicon oxide such as BPSG, PSG, SOG, FOX, USG, HDP oxide, etc. In some example embodiments of the disclosed methods and systems, the second insulating interlayer 160 may be formed using HDP oxide. In other embodiments, the second insulating interlayer 160 may be formed using BPSG substantially different from that of the first insulating interlayer 145.

In an example embodiment of the disclosed methods and systems, an upper face of the second insulating interlayer 160 may be planarized by a CMP process and/or an etch-back process.

After a second photoresist pattern (not shown) is formed on the second insulating interlayer 160, the second insulating interlayer 160 may be partially etched using the second photoresist pattern as an etching mask. Hence, the third contact hole 165 may be formed through the second insulating interlayer 160. The third contact hole 165 may expose the second contact pad 155. The third contact hole 165 may correspond to a bit line contact hole where the bit line 175 is formed.

The second photoresist pattern may then be removed using an ashing process, a stripping process and/or a cleaning process after forming the third contact hole 165.

Figure 5:
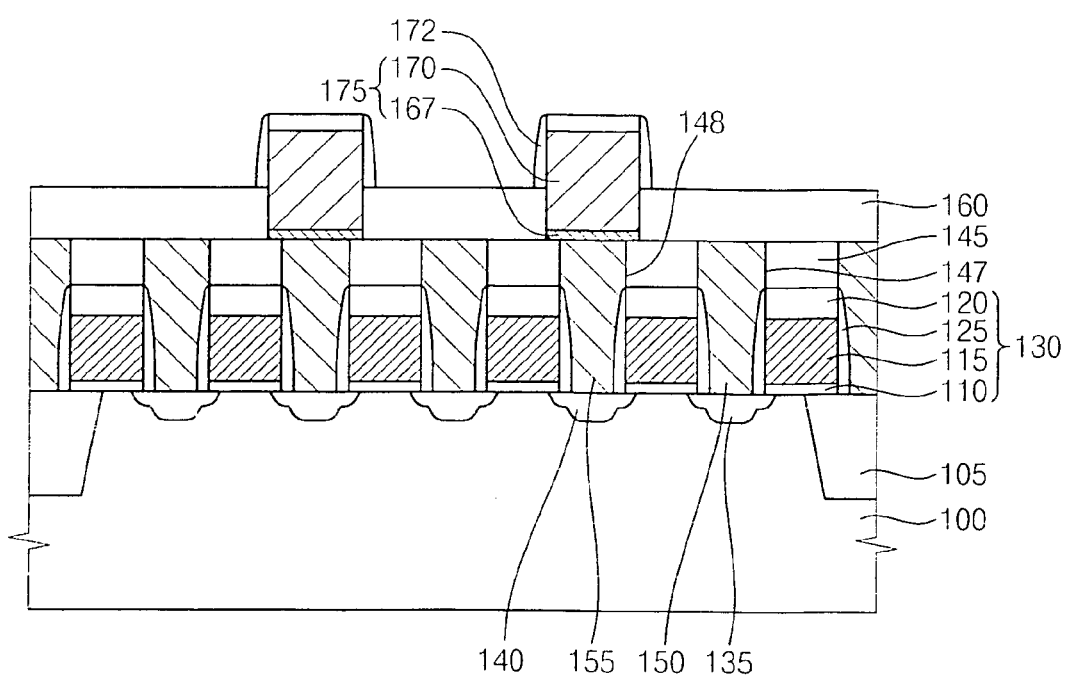

FIG. 5 illustrates various steps for forming the bit line 175 including a metal silicide pattern 167. Referring to FIG. 5, a third conductive layer may be formed on the second insulating interlayer 160 to fill the third contact hole 165.

After a hard mask pattern (not shown) is formed on the third conductive layer, the third conductive layer may be partially etched using the hard mask pattern as an etching mask. Thus, the bit line 175 filling the third contact hole 165 may be formed on the second contact pad 155. The bit line 175 filling the third contact hole 165 may make electrical contact with the second impurity region 140 through the second contact pad 155. In some example embodiments of the disclosed methods and systems, the bit line 175 includes the metal silicide layer pattern 167 and a metal layer pattern 170. The metal silicide layer pattern 167 may be formed between the second contact pad 155 and the metal layer pattern 170 by a silicidation process. Then, a bit line spacer 172 may be formed on a sidewall of the bit line 175 exposed by the second insulating interlayer 160. The bit line spacer 172 may be formed using a nitride such as silicon nitride.

In some example embodiments of the disclosed methods and systems, the bit line 175 may include a first layer pattern of a metal compound, such as the metal silicide pattern 167, and a second layer pattern of a metal compound, such as the metal layer pattern 170. The first layer pattern may be formed using the metal compound such as titanium silicide, tantalum silicide, nickel silicide, copper silicide and so on. The second layer pattern may be formed using the metal such as tungsten, tantalum, titanium, nickel, copper, aluminum and so on.

In an example embodiment of the disclosed methods and systems, when a metal layer is used as the third conductive layer and then thermally treated, the first layer pattern 167 may be formed using a silicidation process with polysilicon including the second contact pad 155 and a respective metal.

In another example embodiment of the disclosed methods and systems, when the third conductive layer is formed using metal, the first layer pattern (i.e., the metal silicide layer pattern 167) may be formed by a silicidation reaction between silicon in the second contact pad 155 and metal in the third conductive layer.

In still another example embodiment of the disclosed methods and systems, an additional metal layer is formed on the second contact pad 155 before forming the third conductive layer, and then the first layer pattern (i.e., the metal silicide layer pattern 167) may be formed between silicon in the second contact pad 155 and metal in the additional metal layer while performing a silicidation process. Here, the second layer pattern (i.e., the metal layer pattern 170) may be formed by patterning the third conductive layer.

Figure 6:
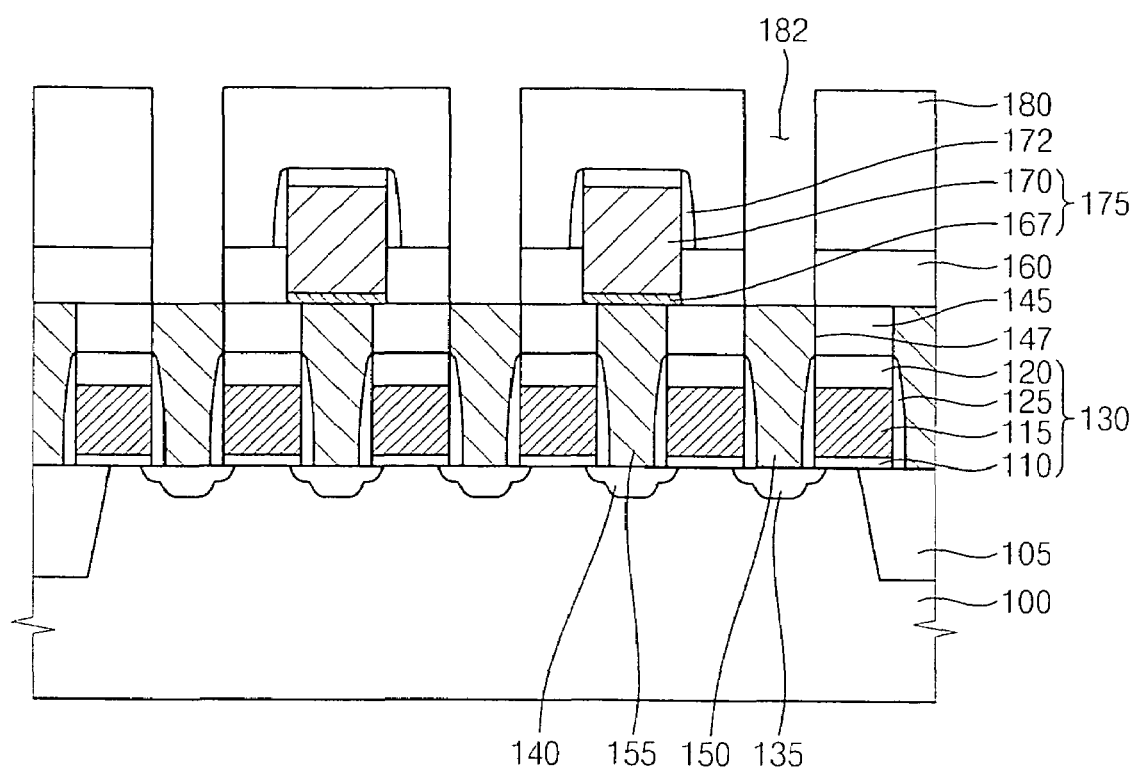

FIG. 6 illustrates various steps for forming a third insulating interlayer 180 and a first opening 182. Referring to FIG. 6, the third insulating interlayer 180 can be formed on the second insulating interlayer 160 to cover the bit line 175. The third insulating interlayer 180 may be formed using silicon oxide such as BPSG, PSG, SOG, FOX, USG, HDP oxide and so on. In some embodiments of the disclosed methods and systems, the third insulating interlayer 180 may be formed using HDP oxide.

In various example embodiments of the disclosed methods and systems, the third insulating interlayer 180 may be formed using silicon oxide substantially the same as that of the second insulating interlayer 160 and/or that of the first insulating interlayer 145. In yet other embodiments, the third insulating interlayer 180 may be formed using silicon oxide different from that of the second insulating interlayer 160 and/or that of the first insulating interlayer 145.

In an example embodiment of the disclosed methods and systems, an upper portion of the third insulating interlayer 180 may be planarized by a CMP process and/or an etchback process.

In an example embodiment of the disclosed methods and systems, an additional insulation layer including nitride may be formed on the bit line 175 and the second insulating interlayer 160, and then the third insulating interlayer 180 may be formed on the additional insulation layer. The additional insulation layer may prevent a generation of a void in a portion of the third insulating interlayer 180 between the bit lines 175.

After a third photoresist pattern (not shown) is formed on the third insulating interlayer 180, the third insulating interlayer 180 and the second insulating interlayer 160 may be partially etched using the third photoresist pattern as an etching mask. Accordingly, the first opening 182 having a first width may be formed through the third insulating interlayer 180 and the second insulating interlayer 160. The first opening 182 exposes the first contact pad 150.

When a semiconductor device uses design rules below about 90 nm, a portion of the first contact pad 150 exposed by the first opening 182 may have a very small area. Thus, a contact plug 190 (see FIG. 8) may not properly make contact with the exposed portion of the first contact pad 150 so that a contact resistance between the first contact pad 150 and the contact plug 190 may increase. As a result, electrical characteristics of the semiconductor device may be deteriorated.

Considering the above mentioned problem, a process for enlarging the first width of the first opening 182 may be performed so that the exposed portion of the first contact pad 150 is enlarged.

Figure 7:
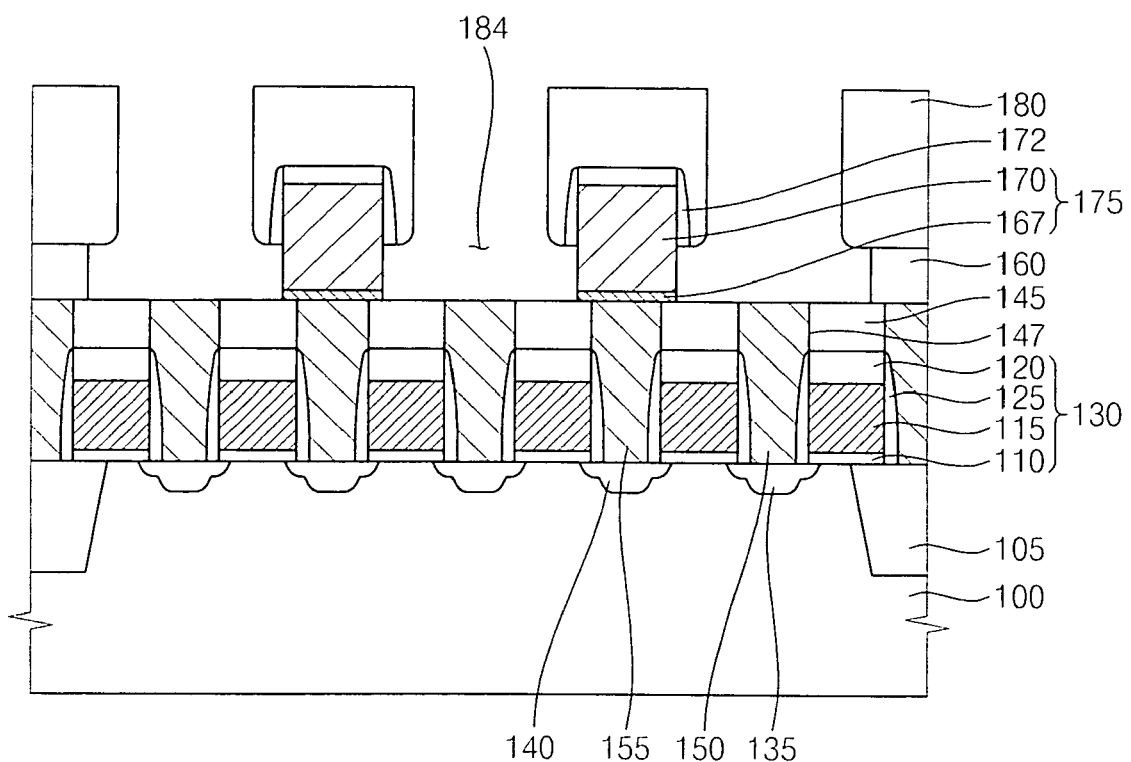

FIG. 7 illustrates various steps for forming a second opening 184 using an etching solution for silicon oxide. Referring to FIG. 7, the third insulating interlayer 180 and the second insulating interlayer 160 exposing a sidewall of the first opening 182 may be partially etched using the etching solution for silicon oxide. The etching solution may have any of the above described compositions.

According to a process for widening the first width of the first opening 182, a second opening 184 having a second width can be formed through the third insulating interlayer 180 and the second insulating interlayer 160. The second width of the second opening 184 may be substantially larger than the first width of the first opening 182. Thus, the exposed portion of the first contact pad 150 may be enlarged.

In the formation of the second opening 184, the second insulating interlayer 180 may be etched until a sidewall of the metal silicide layer pattern 167 is exposed. Since the etching solution for silicon oxide may effectively etch the second insulating interlayer 180 without damage to the metal silicide layer pattern 167, etching related damage of the metal silicide layer pattern 167 may be prevented even though the metal silicide layer pattern 167 is exposed by the second opening 184.

In some embodiments of the prevent invention, the etching solution for silicon oxide may efficiently prevent damage to a metal silicide layer pattern and/or a metal layer pattern in an etching process for enlarging an opening formed through at least one insulating interlayer. As described above, the etching solution for silicon oxide may include about 0.2 to about 5.0 percent by weight of the hydrogen fluoride solution based on a total weight of the etching solution, about 0.05 to about 20.0 percent by weight of the ammonium fluoride solution based on the total weight of the etching solution, about 40.0 to about 70.0 percent by weight of the alkyl hydroxide solution based on the total weight of the etching solution, and remaining water. Examples of the alkyl hydroxide may include ethylene glycol, propylene glycol, glycerol, methanol, ethanol, isopropyl alcohol, etc. These can be used alone or in a mixture thereof.

In some example embodiments of the disclosed methods and systems, the alkyl hydroxide in the etching solution may include ethylene glycol, propylene glycol or glycerol.

When the second insulating interlayer 160 is formed using BPSG and the third insulating interlayer 180 is formed using HDP oxide, the etching solution for silicon oxide may include about 0.5 to about 2.0 percent by weight of the hydrogen fluoride solution, about 10.0 to about 18.0 percent by weight of the ammonium fluoride solution, about 50.0 to about 60.0 percent by weight of the alkyl hydroxide solution based on the total weight of the etching solution, and remaining water.

For example, the etching solution for silicon oxide may include about 0.7 to about 1.2 percent by weight of the hydrogen fluoride solution, about 15.0 to about 18.0 percent by weight of the ammonium fluoride solution, about 54.0 to about 60.0 percent by weight of the alkyl hydroxide solution based on the total weight of the etching solution, and remaining water. Such etching solution for silicon oxide may have an etching selectivity of about 1.0:1.5 to about 1.0:2.5 between an HDP oxide layer and a BPSG layer. Additionally, a volume ratio between the hydrogen fluoride solution and the ammonium fluoride solution may be in a range of about 1.0:7.0 to about 1.0:20.0.

When the second insulating interlayer 160 is formed using HDP oxide and the third insulating interlayer 180 is formed using BPSG, the etching solution for silicon oxide may include about 0.2 to about 0.5 percent by weight of the hydrogen fluoride solution, about 0.05 to about 0.2 percent by weight of the ammonium fluoride solution, about 55.0 to about 70.0 percent by weight of the alkyl hydroxide solution based on the total weight of the etching solution, and remaining water.

For example, the etching solution for silicon oxide may include about 0.2 to about 0.3 percent by weight of the hydrogen fluoride solution, about 0.08 to about 0.12 percent by weight of the ammonium fluoride solution, about 58.0 to about 62.0 percent by weight of the alkyl hydroxide solution, and remaining water. This etching solution for silicon oxide may have an etching selectivity of about 1.0:0.3 to about 1.0:0.5 between an HDP oxide layer and a BPSG layer. Further, a volume ratio of the hydrogen fluoride solution to the ammonium fluoride solution may be in a range of about 1.0:0.2 to about 1.0:0.5.

In some example embodiments of the disclosed methods and systems, the etching process for forming the second opening 184 may be performed by spraying and/or overflowing the etching solution for silicon oxide onto the semiconductor substrate 100.

Figure 8:
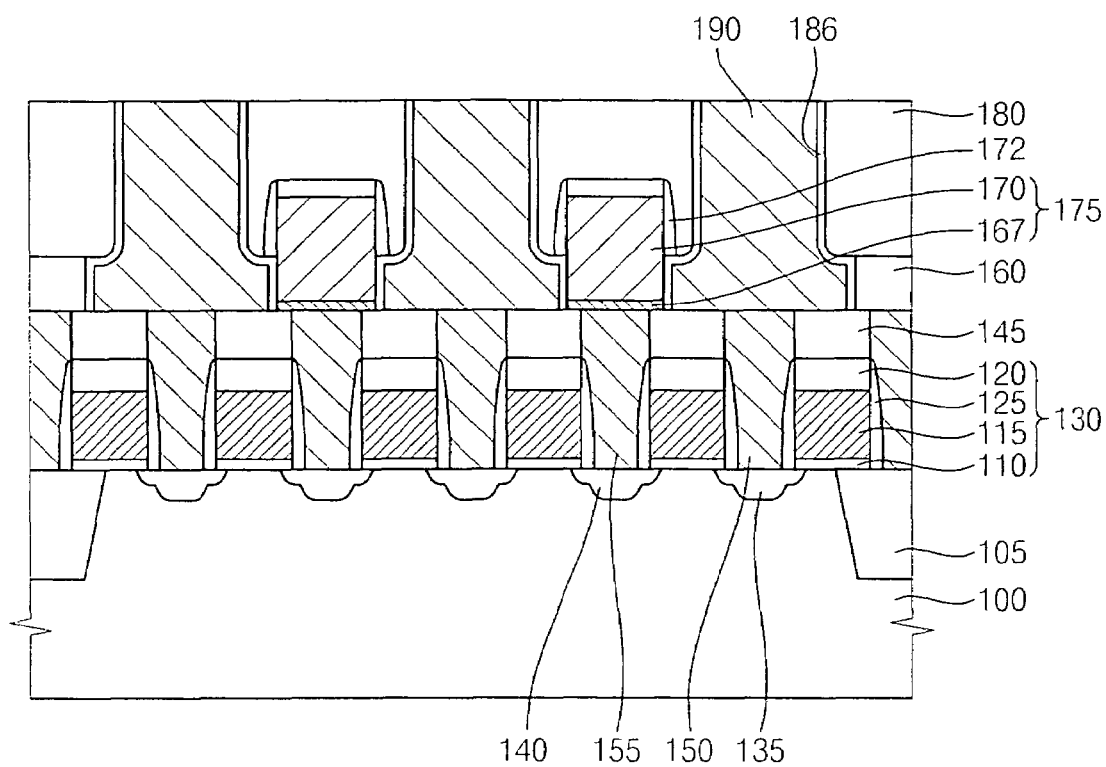

FIG. 8 illustrates various steps for forming an insulation spacer 186 and the contact plug 190. Referring to FIG. 8, the insulation spacer 186 can be formed on a sidewall of the second opening 184, and then a forth conductive layer may be formed on the spacer 186 to fill the second opening 184.

The forth conductive layer may be removed until the third insulating interlayer 180 is exposed by a CMP process and/or an etch back process. Thus, the contact plug 190 for a capacitor is formed on the first contact pad 150 and the first insulating interlayer 145. The contact plug 190 may be formed using doped polysilicon. The contact plug 190 may electrically connect the first contact pad 150 to a lower electrode 220 (see FIG. 10) that is successively formed. The insulation spacer 186 may electrically insulate the contact plug 190 from the bit line 175.

Figure 9:
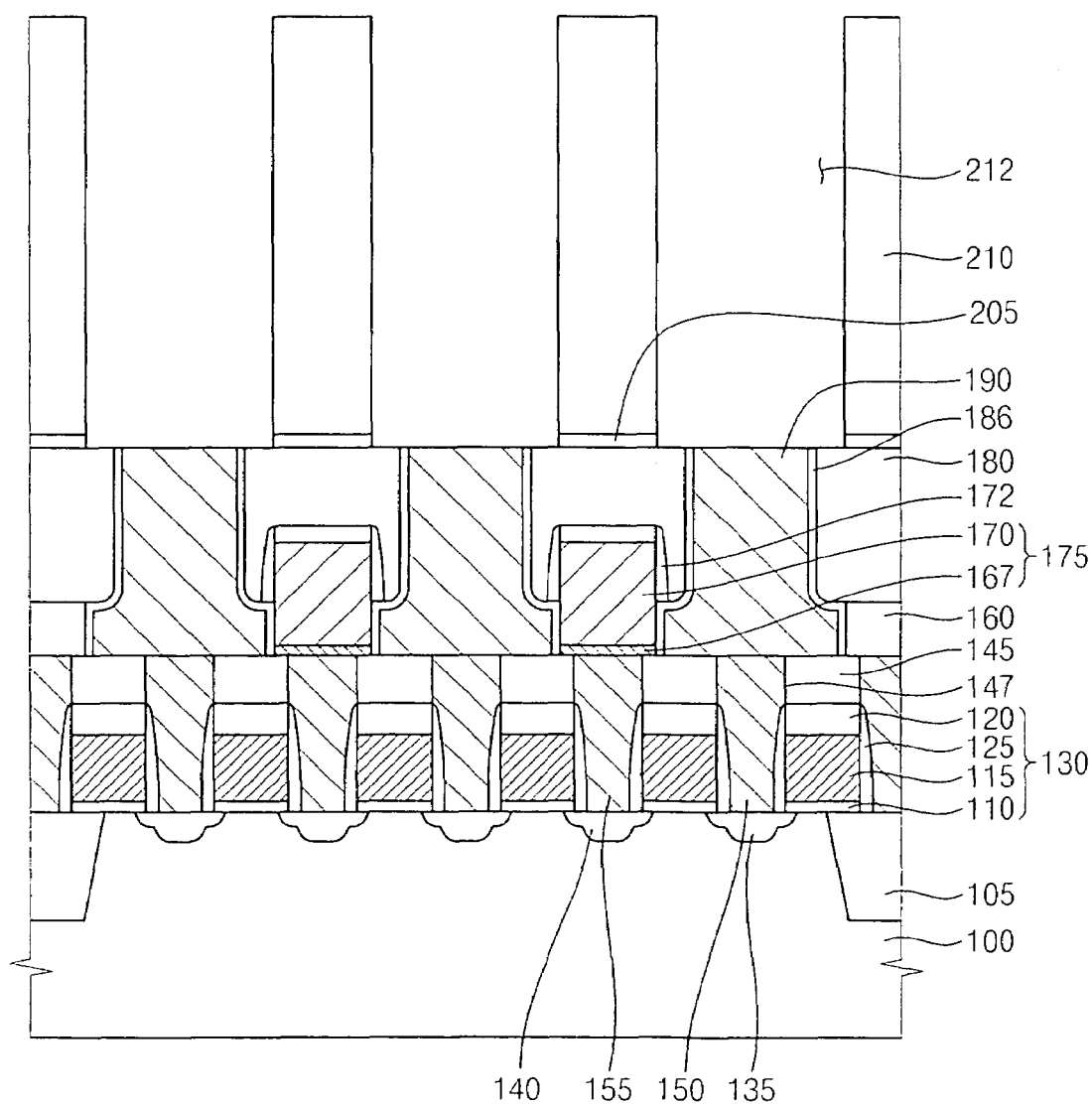

FIG. 9 illustrates various steps for forming an etch stop layer 205, a mold layer 210 and a third opening 212. Referring to FIG. 9, the etch stop layer 205 may be formed on the contact plug 190 and the third insulating interlayer 180. The etch stop layer 205 may prevent the contact plug 190 for the capacitor from being damaged in an etching process for forming the third opening 212 through the mold layer 210. In various embodiments, the etch stop layer 205 may have a thickness of about 10 to about 200 Å measured from an upper face of the third insulating interlayer 180. Additionally, the etch stop layer 205 may be formed using nitride or metal oxide having an etching selectivity relative to the mold layer 210.

The mold layer 210 may be formed on the etch stop layer 205 using silicon oxide. For example, the mold layer 210 may be formed using BPSG, PSG, USG, SOG, FOX, PE-TEOS and so on. The mold layer 210 may have a thickness of about 10,000 to about 20,000 Å based on an upper face of the etch stop layer 205. However, the thickness of the mold layer 210 may vary in accordance with a capacitance of the capacitor because a height of the capacitor may depend on the thickness of the mold layer 210.

After a mask pattern (not shown) is formed on the mold layer 210, the mold layer 210 may be partially etched using the mask pattern as an etching mask, thereby forming the third opening 212 through the mold layer 210. The third opening 212 can expose the etch stop layer 205. Then, the exposed etch stop layer 205 may be etched so that the contact plug 190 is exposed through the third opening 212.

Figure 10:
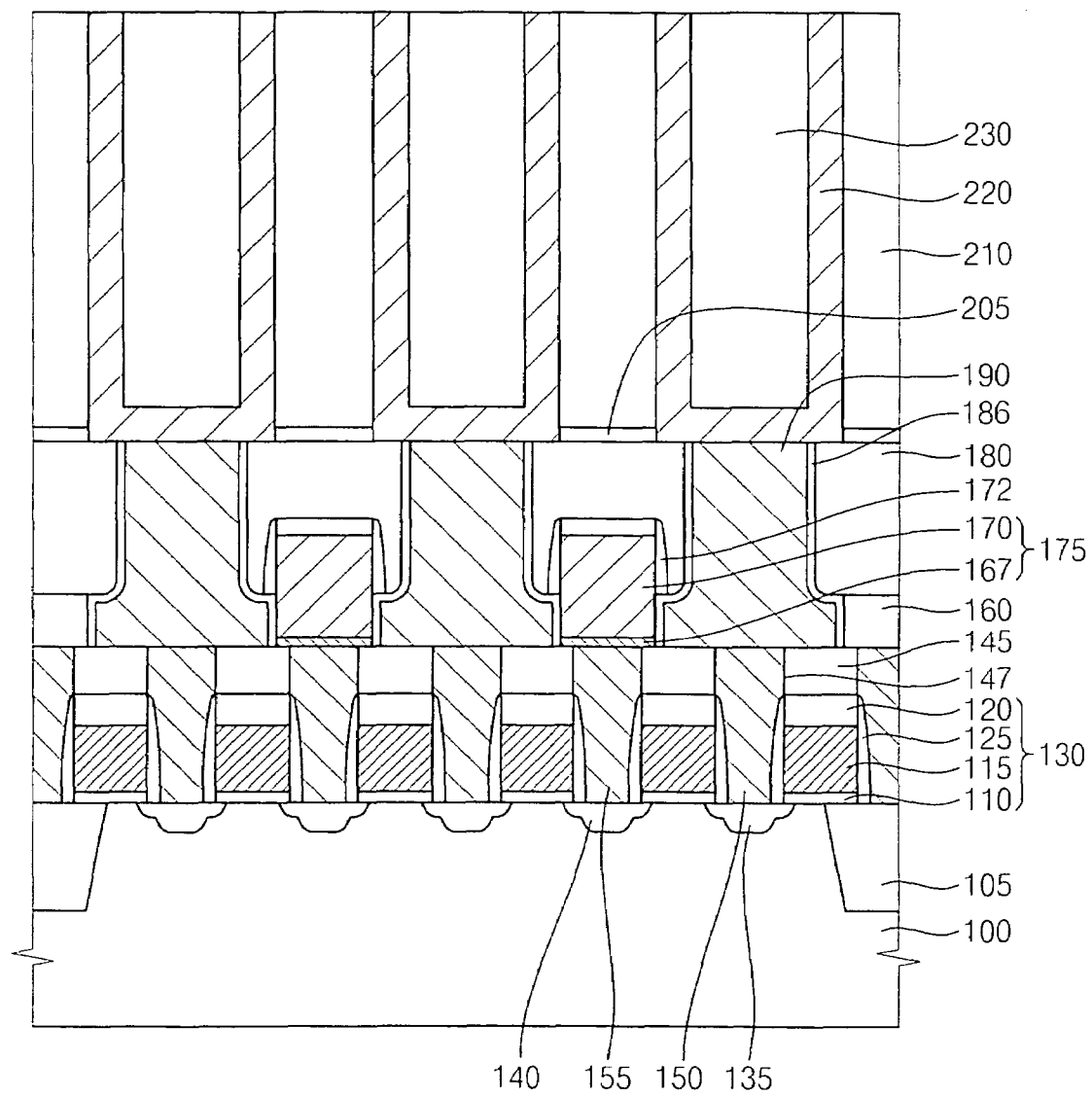

FIG. 10 illustrates various steps for forming the lower electrode 220 and a sacrificial layer pattern 230. Referring to FIG. 10, a lower electrode layer can be formed on the contact plug 190, the mold layer 210 and a sidewall of the third opening 212. In various embodiments, the lower electrode layer may be formed using a metal or a metal nitride such as tungsten, titanium, tungsten nitride, titanium nitride and so on. Additionally, the lower electrode layer may have a thickness of about 300 to about 500 Å measured from an upper face of the contact plug 190.

A sacrificial layer may be formed on the lower electrode layer to fill the third opening 212. In one example embodiment of the disclosed methods and systems, the sacrificial layer may be formed using oxide. In another example embodiment of the disclosed methods and systems, the sacrificial layer may be formed using a photoresist.

The sacrificial layer, the lower electrode layer and the mask pattern may be removed by a CMP process and/or an etch-back process until the mold layer 210 is exposed. Thus, the lower electrode 220 and the sacrificial layer pattern 230 may be formed in the third opening 212. The lower electrode 220 may have a cylindrical shape. The lower electrode 220 may be formed on the contact plug 190 and the sidewall of the third opening 212. The third opening 212 may be completely filled with the sacrificial layer pattern 230.

Figure 11:
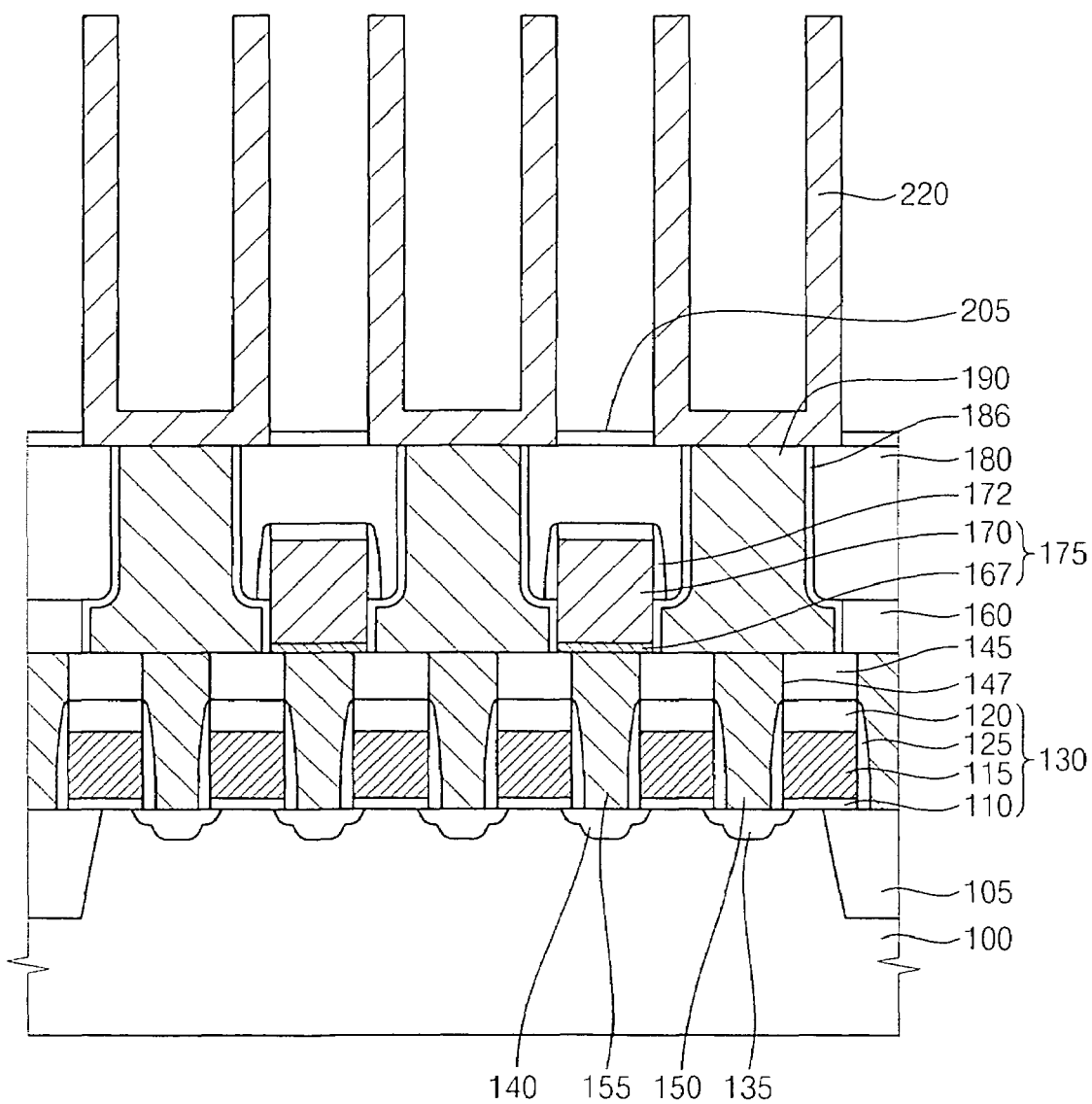

FIG. 11 illustrates various steps for removing the sacrificial layer pattern 230. Referring to FIG. 11, the mold layer pattern 210 may be removed from the lower electrode 220 using an etching solution such as an LAL solution. Accordingly, the lower electrode 220 may be completed on the contact plug 190. The lower electrode 220 may be electrically connected to the first impurity region 135 through the contact plug 190 and the first contact pad 150.

Figure 12:
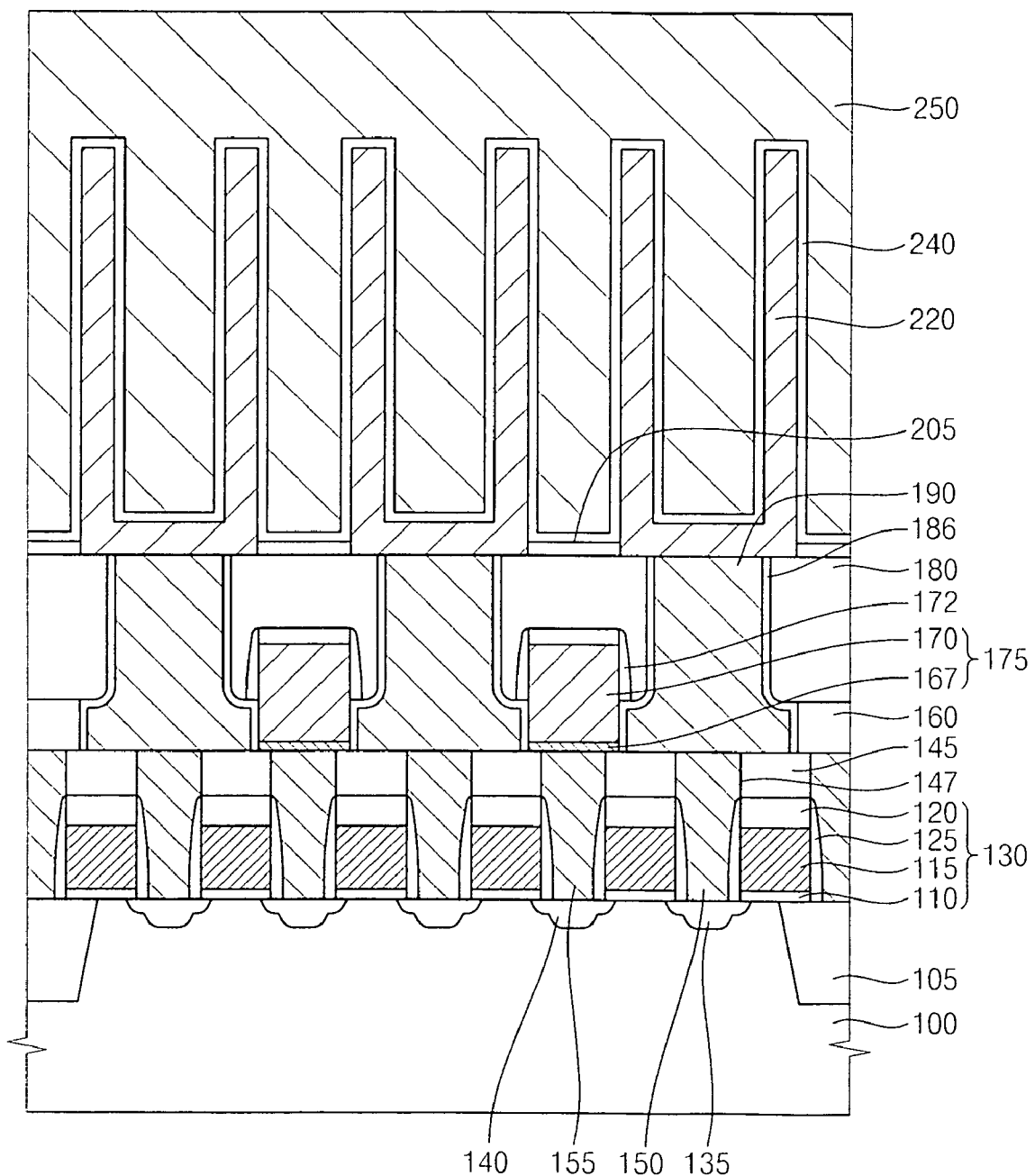

FIG. 12 illustrates various steps for forming a dielectric layer 240 and an upper electrode 250. Referring to FIG. 12, the dielectric layer 240 may be formed on the lower electrode 220. The dielectric layer 240 may have a thickness substantially the same as that of the lower electrode 220.

The dielectric layer 240 may be formed using an oxide, a nitride and/or an oxynitride. For example, the dielectric layer 240 may have a multi-layer structure that includes at least one oxide film and at least nitride film. Alternatively, the dielectric layer 240 may be formed using metal oxide by an ALD process because the dielectric layer 240 including metal oxide formed by the ALD process may have a thin equivalent oxide thickness (EOT) and a low leakage current.

In the atom layer deposition (ALD) process used to form the dielectric layer 240 using metal oxide, a cycle of the ALD process may include the steps of providing a reactive precursor, introducing a first purge gas, providing an oxidizing agent. A step of introducing a second purge gas may be included and, in various embodiments, repeatedly performed. Thus, the dielectric layer 240 including metal oxide can be formed on the lower electrode 240.

The upper electrode 250 may be formed on the dielectric layer 240. The upper electrode 250 may be formed using doped polysilicon, metal, metal nitride and so on. In some embodiments of the disclosed methods and systems, the upper electrode 250 may be formed using metal nitride considering an integration degree of the semiconductor device.

In an example embodiment of the disclosed methods and systems, the upper electrode 250 may be formed using titanium nitride by a CVD process. In the CVD process for forming the upper electrode 250, a reactant including a $TiCl_4$ gas or an $NH_3$ gas may be provided at a temperature below about 550° C.

As a result, the capacitor may be formed over the semiconductor substrate 100. As shown in FIG. 12, such a capacitor may include a lower electrode 220, a dielectric layer 240 and an upper electrode 250. The capacitor may have a cylindrical shape when the lower electrode 220 has the cylindrical shape.

Hereinafter, etching solutions, according to various Examples and Comparative Examples, will be described in detail.

EXAMPLE 1

An etching solution for silicon oxide was prepared by mixing about 1.0 percent by weight of a hydrogen fluoride (HF) solution, about 17.0 percent by weight of an ammonium fluoride ($NH_4F$) solution, about 56.0 percent by weight of an ethylene glycol solution and about 26.0 percent by weight of water based on a total weight of the etching solution.

EXAMPLE 2

An etching solution for silicon oxide was prepared by mixing about 1.5 percent by weight of a hydrogen fluoride solution, about 17.0 percent by weight of an ammonium fluoride solution, about 56.0 percent by weight of an ethylene glycol solution and about 25.5 percent by weight of water based on a total weight of the etching solution.

EXAMPLE 3

An etching solution for silicon oxide was prepared by mixing about 2.0 percent by weight of a hydrogen fluoride solution about 17.0 percent by weight of an ammonium fluoride solution, about 56.0 percent by weight of an ethylene glycol solution and about 25.0 percent by weight of water based on a total weight of the etching solution.

EXAMPLE 4

An etching solution for silicon oxide was prepared by mixing about 0.25 percent by weight of a hydrogen fluoride solution, about 0.1 percent by weight of an ammonium fluoride solution, about 60.0 percent by weight of an ethylene glycol solution and about 38.75 percent by weight of water based on a total weight of the etching solution.

COMPARATIVE EXAMPLE 1

An etching solution including about 1.0 percent by weight of a hydrogen fluoride (HF) solution based on a total weight of the etching solution was prepared.

COMPARATIVE EXAMPLE 2

An etching solution was prepared by mixing about 1.0 percent by weight of a hydrogen fluoride solution, about 10.0 percent by weight of an ammonium fluoride ($NH_4F$) solution based on a total weight of the etching solution with the remaining weight being water.

COMPARATIVE EXAMPLE 3

An etching solution was prepared by mixing about 1.0 percent by weight of a hydrogen fluoride solution, about 35.0 percent by weight of an ammonium fluoride solution based on a total weight of the etching solution with the remaining weight being water.

COMPARATIVE EXAMPLE 4

An etching solution was prepared by mixing about 1.0 percent by weight of a hydrogen fluoride solution, about 56.0 percent by weight of an ethylene glycol solution based on a total weight of the etching solution with the remaining weight being water.

COMPARATIVE EXAMPLE 5

An LAL 200 solution was prepared by mixing about 0.7 percent by weight of a hydrogen fluoride solution, about 17.0 percent by weight of an ammonium fluoride solution based on a total weight of the etching solution with the remaining weight being deionized water.

Evaluation of Characteristics of Etching Solutions Relative to Metal Silicide

An etched amount of titanium silicide layer was measured to evaluate characteristics of the etching solutions according to Example 1 and Comparative Examples 1 to 5 relative to metal silicide.

Six samples including titanium silicide patterns were prepared, and then the six samples were inserted into six beakers including the etching solutions according to Example 1 and Comparative Examples 1 to 5, respectively. After about one minute, titanium concentrations in the etching solutions were measured using an inductively coupled plasma-mass spectroscopy so as to identify an etched amount of the titanium silicide pattern relative to the etching solution. The results are shown in the following Table 1.

TABLE 1

| Etching Solutions | Concentration of Ti [PPb] |
|---|---|
| Example 1 | 0.26 |
| Comparative Example 1 | 32.88 |
| Comparative Example 2 | 4.32 |
| Comparative Example 3 | 0.91 |
| Comparative Example 4 | 3.88 |
| Comparative Example 5 | 1.27 |

As shown in Table 1, the etched amount of the titanium silicide pattern relative to the etching solution was reduced in accordance with an increase of a content of the ammonium fluoride solution when the etching solution included about 1.0 percent by weight of the hydrogen fluoride solution. When about 56.0 percent by weight of the ethylene glycol solution was added into the etching solution, the etched amount of the titanium silicide pattern relative to the etching solutions was effectively reduced.

When the etching solution included about 1.0 percent by weight of the hydrogen fluoride solution, about 17.0 percent by weight of the ammonium fluoride solution and about 56.0 percent by weight of the ethylene glycol solution, the etched amount of the titanium silicide pattern was about five times smaller than that of the titanium silicide pattern relative to the LAL 200 solution.

Evaluation of Etching Characteristics of Etching Solution Relative to BPSG Layers According to Example 1, etched amounts of boro-phosphor silicate glass (BPSG) layers and variations in the etched amounts of the BPSG layers oxide were obtained using the etching solution.

Figure 13:
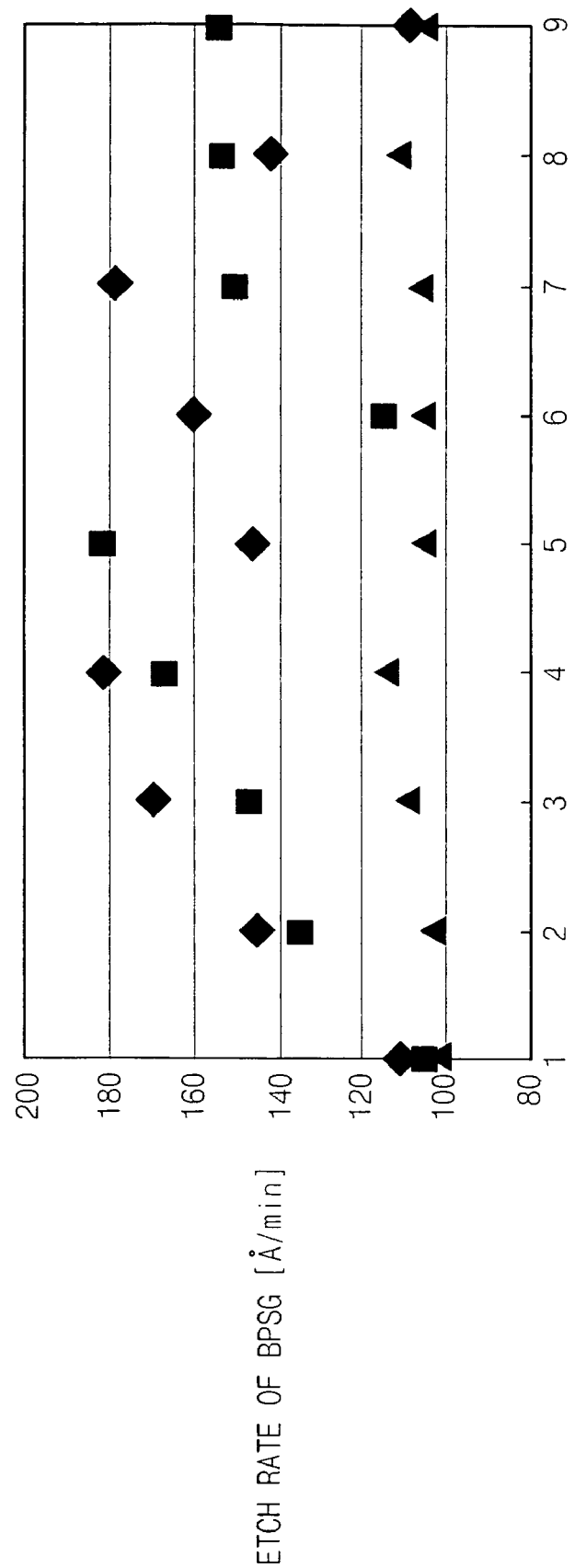
FIG. 13 is a graph showing an etched amount and an etched amount variation of a silicon oxide layer relative to an etching solution according to Example 1.

FIG. 13 is a graph showing the etched amounts and the variations in the etched amounts of the BPSG layers relative to the etching solution according to Example 1. In FIG. 13, "□" indicates the etched amounts and the variations in the etched amounts of the BPSG layer by overflowing the etching solution on the BPSG layer, and "■" represents the etched amounts and the variations in the etched amounts of the BPSG layer by spraying the etching solution onto the BPSG layer. Additionally, "▲" means the etched amounts and the variations in the etched amounts of the BPSG layer by spraying and overflowing the etching solution on the BPSG layer.

As shown in FIG. 13, when the BPSG layer was etched by overflowing the etching solution on the BPSG layer, a difference between the maximum etched amount and the minimum etched amount was about 73 Å so that the variation in the etched amounts (□) of the BPSG layer was relatively great. When the BPSG layer was etched by spraying the etching solution onto the BPSG layer, a difference between the maximum etched amount and the minimum etched amount was about 77 Å such that the variation in the etched amounts (■) of the BPSG layer was even greater. However, when the BPSG layer was etched by spraying and overflowing the etching solution on the BPSG layer, a difference between the maximum etched amount and the minimum etched amount was about 12 Å so that the variation in the etched amounts (▲) of the BPSG layer was relatively small. Therefore, a silicon oxide layer such as a BPSG layer may be uniformly etched when the silicon oxide layer is etched by spraying and overflowing an etching solution on the silicon oxide layer.

Evaluation of Etching Characteristics of Etching Solutions Relative to HDP Oxide Layers Experiments show that there were measured etched amounts of HDP oxide layers and variations in the etched amounts of the HDP oxide layers relative to etching solutions according to Examples 1 to 3 and Comparative Example 5.

Figure 14:
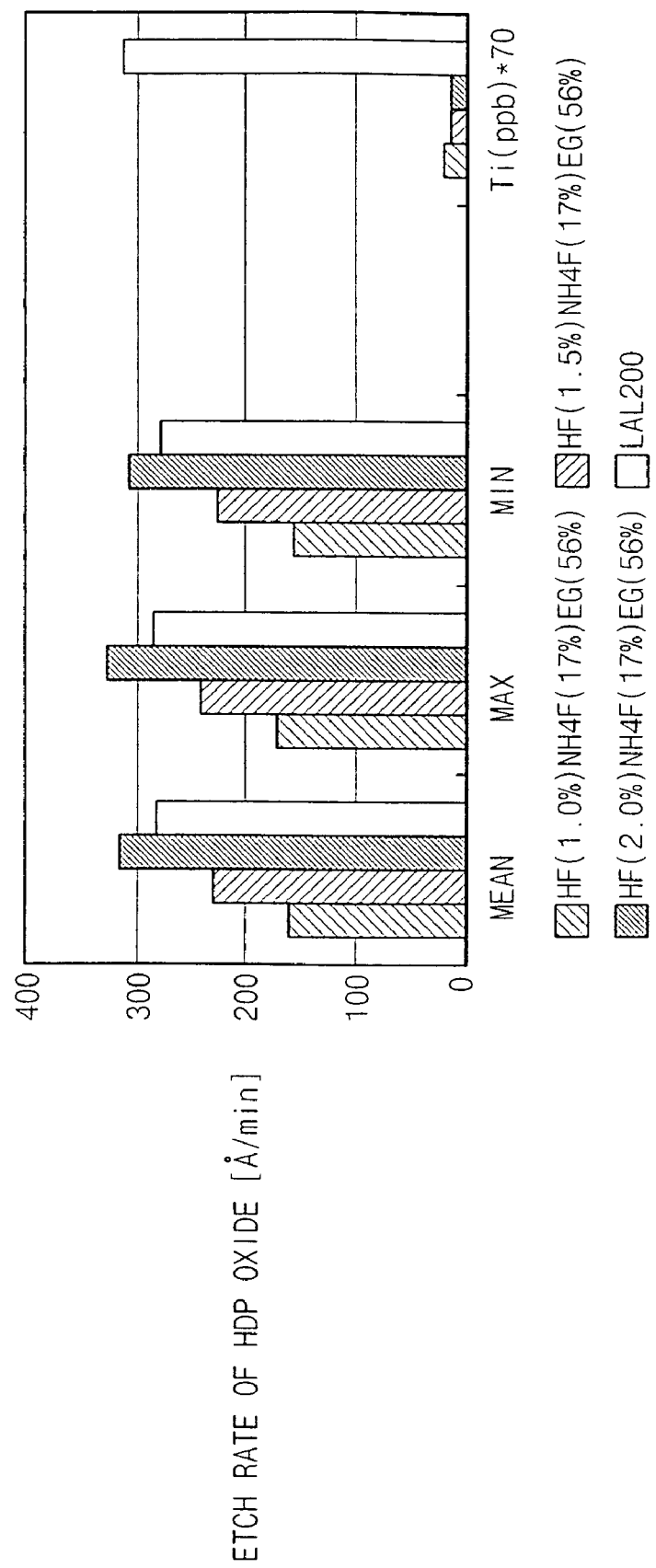
FIG. 14 is a graph showing etched amounts and variations in the etched amounts of silicon oxide layers relative to etching solutions according to Examples 1 to 3 and Comparative Example 5.

FIG. 14 is a graph showing the etched amounts and variations in the etched amounts of the HDP oxide layers relative to the etching solutions according to Examples 1 to 3 and Comparative Example 5.

As shown in FIG. 14, the etched amounts of the HDP oxide layers were linearly increased according as the amounts of the hydrogen fluoride solutions in the etching solutions in Examples 1 to 3 were increased. When the HDP oxide layers were etched using the etching solutions, according to Examples 1 to 3, variations in the etched amounts of the HDP oxide layers were substantially identical to one another. However, etched amounts of titanium silicide layers relative to the etching solutions according to Examples 1 to 3 were about 10 percent of an etched amount of the LAL 200 solution according to Comparative Example 5.

Evaluation of Etching Characteristics of Etching Solutions Relative to BPSG Layers and HDP Oxide Layers Etch rates of BPSG layers and HDP oxide layers and etching selectivities of the BPSG layer relative to the HDP oxide layers were measured when the BPSG layers and the HDP oxide layers were etched using the etching solutions according to Examples 3 and 4, and Comparative Example 5. The measured results are shown in the following Table 2.

TABLE 2

|  | Example 3 | Example 4 | Comparative Example 5 |
|---|---|---|---|
| Etch Rate of BPSG Layer [Å/min] | 165 | 37 | 210 |
| Etch Rate of HDP Oxide Layer [Å/min] | 312 | 13 | 282 |
| Etching Selectivity of BPSG Layer relative to HDP Oxide Layer | 0.52 | 2.50 | 0.74 |

As shown in Table 2, when the BPSG layer and the HDP oxide layer were etched using the etching solution shown in Example 3 (including about 2.0 percent by weight of the hydrogen fluoride solution, about 16.0 percent by weight of the ammonium fluoride solution and about 56.0 percent by weight of the ethylene glycol solution), the etch rate of the BPSG layer was about 165 Å/minute, the etch rate of the HDP oxide layer was about 312 Å/minute, and the etching selectivity of the BPSG layer relative to the HDP oxide layer was about 0.52. When the BPSG layer and the HDP oxide layer were etched using the etching solution used in Example 4 (including about 0.25 percent by weight of the hydrogen fluoride, about 0.1 percent by weight of the ammonium fluoride and about 60.0 percent by weight of the ethylene glycol), the etch rate of the BPSG layer was about 37 Å/minute, the etch rate of the HDP oxide layer was about 13 Å/minute, and the etching selectivity of the BPSG layer relative to the HDP oxide layer was about 2.95. Therefore, the etching solution according to Example 3 may advantageously etch the HDP oxide layer rather than the BPSG layer, whereas the etching solution according to Example 4 may desirably etch the BPSG layer rather than the HDP oxide layer.

According to the disclosed methods and systems, an etching solution for silicon oxide may effectively etch a silicon oxide layer without damage to a metal silicide pattern exposed by an opening during a process for enlarging the opening formed through the silicon oxide layer. Additionally, the etching solution for silicon oxide may have a proper etching selectivity between different silicon oxide layers, such as a BPSG layer and an HDP oxide layer, so that the etching solution for silicon oxide may advantageously etch a desired silicon oxide layer.

In the process for enlarging the opening formed through the silicon oxide layer, since the etching solution for silicon oxide may effectively prevent the damage to the metal silicide layer exposed by the enlarged opening, an increase in a resistance of a conductive structure including the metal silicide layer may be sufficiently prevented after forming a spacer on a sidewall of the enlarged opening.

The foregoing is illustrative of the disclosed methods and systems and is not to be construed as limiting thereof. Although a few example embodiments of the disclosed methods and systems have been described, those skilled in the art will readily appreciate that many modifications are possible in the exemplary embodiments without materially departing from the novel teachings and advantages, of the disclosed methods and systems. Accordingly, all such modifications are intended to be included within the scope of the disclosed methods and systems as defined in the claims. In the claims, means plus function clauses are intended to cover the structures described herein as manufacturing the recited function, and not only structural equivalents but also equivalent structures. Therefore, it is to be understood that the foregoing is illustrative of the disclosed methods and systems and is not to be construed as limited to the specific embodiments disclosed, and that modifications to the disclosed embodiments, as well as other embodiments, are intended to be included within the scope of the appended claims. The disclosed methods and systems are defined by the following claims, with equivalents of the claims to be included therein.

What is claimed is:

1. A method of manufacturing a semiconductor device, comprising:

forming a first contact pad and a second contact pad on a substrate;

forming a conductive structure including a metal suicide layer pattern electrically connected to the second contact pad;

forming a silicon oxide layer including different silicon oxides on the substrate to cover the conductive structure, the silicon oxide layer including a first opening exposing the first contact pad;

etching the silicon oxide layer using an etching solution for etching the different silicon oxides with an etching selectivity while preventing damage to the metal silicide layer pattern to form a second opening which is wider than the first opening; and forming a contact plug in the second opening, the contact plug having a lower portion which is wider than an upper portion, wherein the etching solution comprises about 0.2 to about 5.0 percent by weight of a hydrogen fluoride solution, about 0.05 to about 20.0 percent by weight of an ammonium fluoride solution, about 40.0 to about 70.0 percent by weight of an alkyl hydroxide solution and water.

2. The method of claim 1, wherein the etching solution includes the weights of the hydrogen fluoride solution, the ammonium fluoride solution and the alkyl hydroxide solution with the remaining weight of the etching solution composed essentially of water.

3. The method of claim 1, wherein the silicon oxide layer comprises at least two selected from the group consisting of BPSG, HDP oxide, PSQ, USQ, SOQ, FOX and PE-TEOS.

4. The method of claim 1, wherein the alkyl hydroxide solution comprises an alcohol-based material.

5. The method of claim 4, wherein the alkyl hydroxide solution comprises at least one selected from the group consisting of ethylene glycol, propylene glycol, glycerol, methanol, ethanol and isopropyl alcohol.

6. The method of claim 1, prior to forming the silicon oxide layer, further comprising:

forming a first impurity region and a second impurity region on the substrate;

forming a first lower silicon oxide layer on the substrate to cover the first and the second impurity regions, wherein the first and the second contact pads are formed on the first and the second impurity regions through the first lower silicon oxide layer; and forming a second lower silicon oxide layer on the first lower silicon oxide layer, wherein the conductive structure having a metal layer pattern on the metal suicide layer pattern is formed through the second lower silicon oxide layer.

7. The method of claim 1, wherein the second opening is formed to expose the metal silicide layer pattern of the conductive structure.

8. The method of claim 1, wherein the metal silicide layer pattern comprises one selected from the group consisting of titanium silicide, tantalum silicide, nickel silicide and copper silicide.

9. The method of claim 1, further comprising forming a spacer between the contact plug and an inside of the second opening to electrically insulate the conductive structure from the contact plug.

10. A method of manufacturing a semiconductor device, comprising:

forming a first contact pad and a second contact pad on a substrate;

forming a conductive structure including a metal silicide layer pattern electrically connected to the second contact pad;

forming first and second silicon oxide layers of respectively different first and second silicon oxide materials on the substrate to cover the conductive structure, the first and second silicon oxide layers including a first opening exposing the first contact pad, and the first silicon oxide layer interposed between the substrate and the second silicon oxide layer;

etching the first and second silicon oxide layers using an etching solution which etches the first silicon oxide material at a greater etch rate than the second silicon oxide material, wherein the etching increases a width of the first opening to define a second opening, and wherein a width at a lower portion of the second opening adjacent the first oxide layer is greater than a width of an upper portion of the second opening adjacent the second oxide layer; and forming a contact plug in the second opening, the contact plug having a lower portion adjacent the first oxide layer which is wider than an upper portion adjacent the second oxide layer, wherein the etching solution comprises about 0.2 to about 5.0 percent by weight of a hydrogen fluoride solution, about 0.05 to about 20.0 percent by weight of an ammonium fluoride solution, about 40.0 to about 70.0 percent by weight of an alkyl hydroxide solution and water.

* * * * *